United States Patent [19]

Jones, Jr. et al.

[11] Patent Number: 5,190,893

[45] Date of Patent: Mar. 2, 1993

[54] PROCESS FOR FABRICATING A LOCAL INTERCONNECT STRUCTURE IN A SEMICONDUCTOR DEVICE

[75] Inventors: Robert E. Jones, Jr.; Hisao Kawasaki, both of Austin, Tex.

[73] Assignee: Motorola Inc., Schaumburg, Ill.

[21] Appl. No.: 677,945

[22] Filed: Apr. 1, 1991

[51] Int. Cl.⁵ ..................... H01L 21/44; H01L 21/48
[52] U.S. Cl. .................................. 437/192; 437/200; 437/57; 437/60
[58] Field of Search .................. 437/200, 57, 56, 34, 437/192

[56] References Cited

U.S. PATENT DOCUMENTS

| | | | |
|---|---|---|---|
| 4,657,628 | 4/1987 | Holloway et al. | 156/643 |
| 4,980,020 | 12/1990 | Douglas | 156/643 |
| 4,994,402 | 2/1991 | Chiu | 437/192 |

FOREIGN PATENT DOCUMENTS

| | | | |
|---|---|---|---|
| 62-61346 | 3/1987 | Japan | 437/200 |
| 63-12132 | 1/1988 | Japan | 437/200 |

OTHER PUBLICATIONS

"VLSI Local Interconnect Level Using Titanium Nitride," by Thomas Tang et al., 1985 IEDM Proceedings, pp. 590-593.
"A New Device Interconnect Scheme for Sub-Micron VLSI," by Devereaux C. Chen et al., 1984 IEDM Proceedings, pp. 118-121.

Primary Examiner—Olik Chaudhuri
Assistant Examiner—Ramamohan R. Paladugu
Attorney, Agent, or Firm—Patricia S. Goddard

[57] ABSTRACT

A local interconnect structure is formed in a semiconductor device. In one form, the semiconductor device has two conductive features (one of 54) and (56) which are to be electrically connected. A layer of metal (62), for instance titanium, is deposited on the device. The layer of metal is patterned to form a strap (64) which connects the two conductive features. After patterning the layer of metal to form the strap, the strap is thermally nitrided to form a conductive metal nitride local interconnect (66).

14 Claims, 3 Drawing Sheets

PROCESS FOR FABRICATING A LOCAL INTERCONNECT STRUCTURE IN A SEMICONDUCTOR DEVICE

TECHNICAL FIELD OF THE INVENTION

The present invention is related to semiconductor fabrication processes in general, and more specifically to processes for fabricating local interconnect structures in a semiconductor device.

BACKGROUND OF THE INVENTION

Local interconnects are used to electrically connect two conductive elements of a semiconductor die. The term "local" refers to proximity of the two elements with respect to one another. In other words, the two conductive elements are relatively close to one another. Typically, the elements which are connected by local interconnects are doped regions in a semiconductor substrate or conductive structures overlying the substrate. Most often the semiconductor substrate is a single crystal silicon wafer and the overlying conductive structures are made of doped or undoped polysilicon or of a metal silicide. The local interconnect which connects the two conductive elements is usually comprised of titanium.

Illustrated in FIGS. 1A–1C is a known method for fabricating a local interconnect structure in a semiconductor device. In each of these figures, a semiconductor device 10 is partially illustrated in a cross-sectional view. As illustrated in FIG. 1A, semiconductor device 10 includes a substrate 12 which is made of silicon. Doped regions 14 are formed in substrate 12 in a conventional manner and are of either N-type or P-type conductivity. A conductive structure, such as a gate 16, is formed over substrate 12. The gate is made of polysilicon, a term which refers to polycrystalline silicon. Gate 16 is usually separated from substrate 12 by a gate oxide 17 and may have additional isolation, such as that provided dielectric sidewall spacers 18. Sidewall spacers 18 are typically formed of silicon dioxide or silicon nitride.

To form a local interconnect, a titanium layer 20 is deposited onto device 10 such that the titanium layer 20 is in contact with gate 16 and doped regions 14, as illustrated in FIG. 1A. The titanium layer 20 is then converted to a titanium nitride (TiN) layer 22 by thermally reacting the titanium in an ammonia ($NH_3$) or a nitrogen ($N_2$) ambient. TiN layer 22 is illustrated in FIG. 1B and is differentiated from titanium layer 20 of FIG. 1A by different cross-hatching. During the thermal nitridation process, the titanium layer also reacts with adjacent silicon regions, such as gate 16 and doped regions 14, to form titanium silicide ($TiSi_2$) regions 24. Titanium silicide regions 24 are desirable by-products of the nitridation because the silicide reduces sheet resistance of the polysilicon and also improves contact resistance. (Historically, the process illustrated in FIGS. 1A and 1B was first used with the objective of forming $TiSi_2$, after which all of the TiN was removed by a selective wet chemical etch.) As illustrated in FIG. 1C, a local interconnect 26 is then defined by patterning TiN layer 22. Local interconnect 26 is also referred to as a "strap". TiN local interconnect 26 is a conductive metal nitride and therefore is able to electrically connect gate 16 to one of the doped regions 14.

Existing processes for forming local interconnects have various manufacturing problems. For example, a problem with the process described above is that it is difficult to etch the TiN layer to form the strap without damaging portions of the titanium silicide regions. Some wet etches have been demonstrated which can remove TiN selective to $TiSi_2$; however, these etches can only slowly remove certain titanium compounds which form over dielectric regions. During nitridation, titanium not only reacts with nitrogen and the underlying silicon but also reacts with underlying dielectric regions, such as sidewall spacers 18 and field oxide region 28. The reaction creates a titanium compound 29 on the dielectric regions, illustrated in FIG. 1C, which is not easily removed upon patterning the strap. Although the exact formula of the titanium compound which is formed on dielectric regions is not known, it has been shown that the compound can be conductive and can thus short-circuit elements in a semiconductor device. Extending the duration of a wet etch may remove the undesirable titanium compounds, but an extended etch may also detrimentally affect other regions of the device, for instance may etch some of the $TiSi_2$ regions. Furthermore, a wet etch etches TiN in an isotropic manner such that the geometry of the masked or protected regions of TiN, in other words those regions which are to remain and function as a local interconnects, becomes substantially undercut during an extended etch. A common goal of dry etches is to provide anisotropic etching which does not result in such undercutting. Therefore, the semiconductor industry as a whole is moving away from wet etches toward dry etches because dry etches are more suitable for VLSI (very large scale integration) and ULSI (ultra large scale integration) applications. In other words dry etches are more suitable for smaller geometries. A suitable, easily implemented dry etch which removes TiN selective to $TiSi_2$ is not yet available.

Another known method of forming a local interconnect structure is to employ cobalt silicide ($CoSi_2$) regions instead of $TiSi_2$ regions. Prior to depositing a titanium layer, a layer of cobalt is deposited and reacted with underlying, adjacent silicon regions to form $CoSi_2$. Unreacted portions of the cobalt layer are removed, followed by the formation of a TiN strap as illustrated and described earlier. One advantage in using $CoSi_2$ regions instead of $TiSi_2$ regions is that $CoSi_2$ provides a good etch stop for patterning TiN using dry etch chemistries. However, using $CoSi_2$ does not eliminate the problem of undesirable titanium compounds being formed above dielectric regions during nitridation of a titanium layer. To avoid the problem of unwanted reactions between titanium and dielectric materials, TiN can be sputtered onto a semiconductor device and then patterned to form a strap. Sputtering is performed at temperatures much lower than temperatures used for thermal nitridation, therefore the titanium does not react with dielectric regions. However, straps which are formed from sputter deposited TiN frequently have high contact resistance and are thus undesirable. In addition sputter deposition of TiN straps has been found to produce substantial variations in contact resistances of straps formed within the device and also across a plurality of devices on a silicon wafer substrate.

Therefore, a need exists for an improved process for fabricating a semiconductor device, and more specifically a process for fabricating local interconnect structures in a semiconductor device which enables a local interconnect to be selectively patterned without damaging other regions of the semiconductor device, which allows the local interconnect to be patterned using a dry etch chemistry, which does not produce undesirable compounds on the semiconductor device, and which results in local interconnect structures having low and substantially uniform contact resistance.

BRIEF SUMMARY OF THE INVENTION

The present invention fulfills the above need, thereby overcoming disadvantages associated with known semiconductor fabrication processes. In one form, a semiconductor device has two conductive features which are to be electrically connected. A layer of metal is deposited on the semiconductor device and then patterned to form a strap which electrically connects the two conductive features. After patterning the layer of metal to form the strap, the strap is thermally nitrided to form a conductive metal nitride local interconnect.

DETAILED DESCRIPTION OF A PREFERRED EMBODIMENT

The present invention establishes a method for forming a local interconnect structure in a semiconductor device which resolves the problems of known processes discussed previously. In particular, the present invention resolves problems related to etch selectivity in patterning a local interconnect and related to unwanted reactions which occur during nitridation while avoiding increased contact resistance in the device. The manner in which the present invention resolves these problems is by patterning a metal layer which is used to form a local interconnect prior to thermally nitriding the metal layer. In patterning the metal layer before converting the metal to a metal nitride, the metal is removed from dielectric regions and therefore cannot react with the dielectric material to form undesirable metal compounds. Etch selectivity is achieved by forming metal silicide regions from a metal which is different than the metal used to form the local interconnect. Contact resistance is kept low because the metal nitride is formed by a thermal process rather than a sputter deposition process.

Figure 1A:
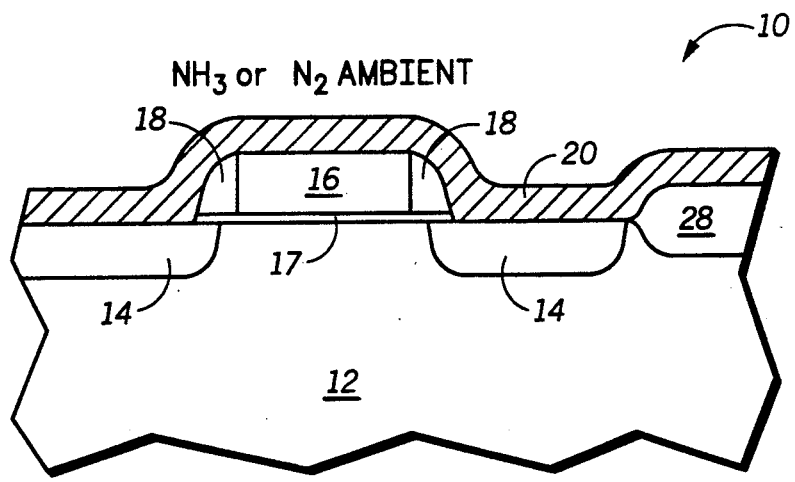
FIGS. 1A–1C are cross-sectional views of a portion of a semiconductor device illustrating a known process for fabricating a local interconnect structure.
Figure 1B:
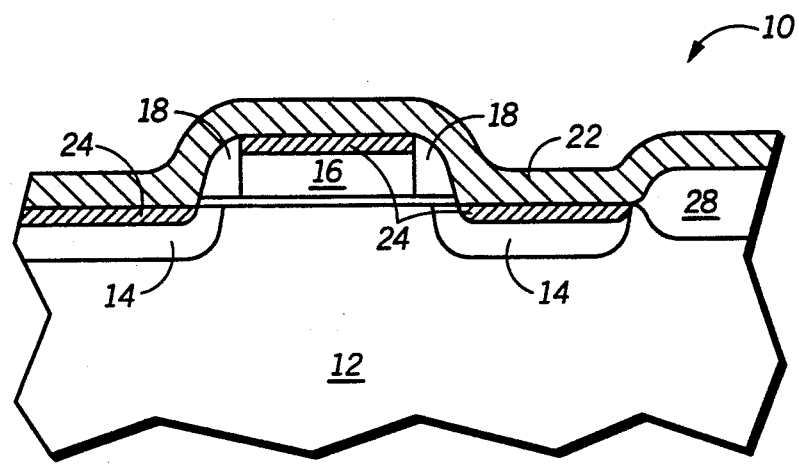
Figure 1C:
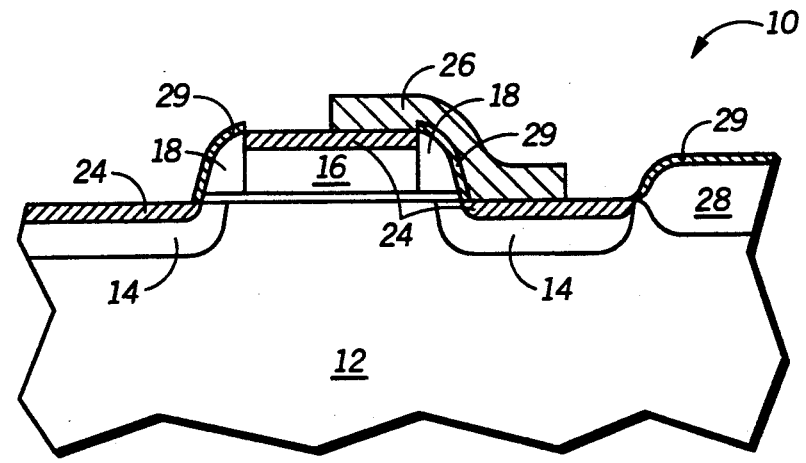
Figure 2A:
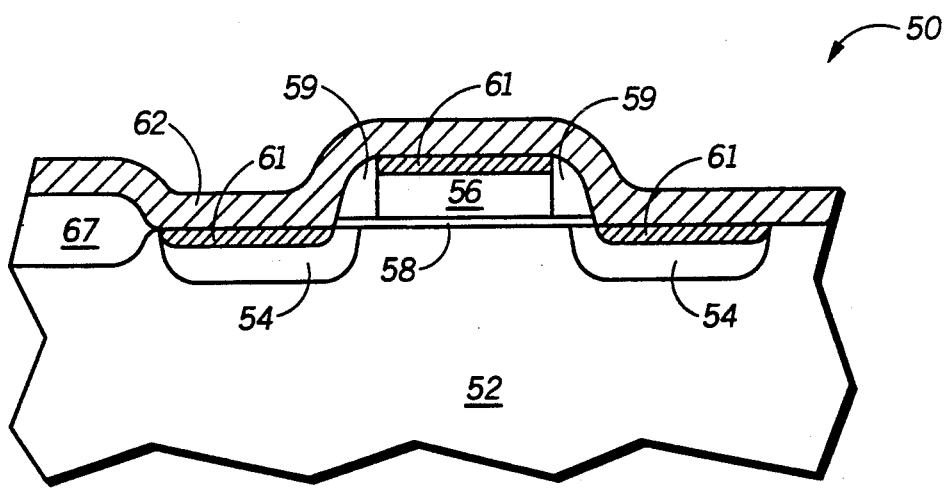
FIGS. 2A–2C are cross-sectional views illustrating a process for fabricating a local interconnect structure in a semiconductor device in accordance with the present invention.
Figure 2B:
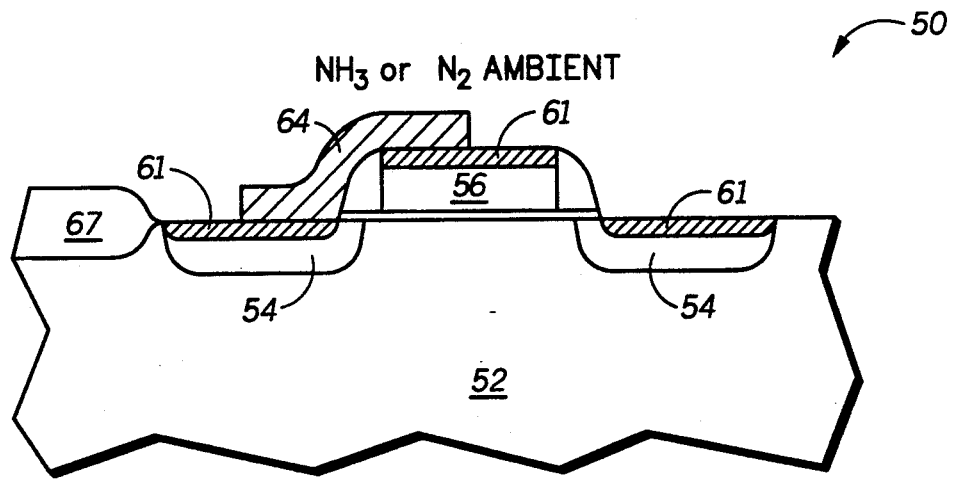
Figure 2C:
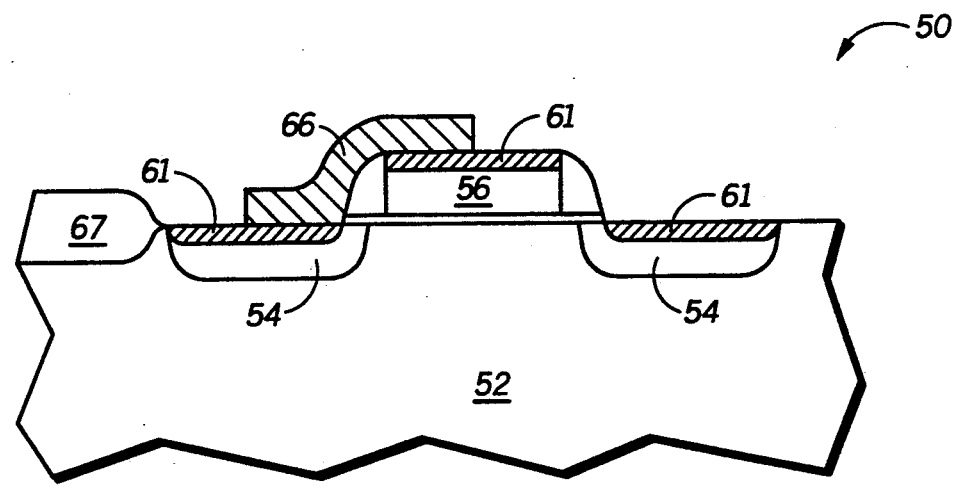

Illustrated in FIGS. 2A–2C are cross-sectional views of a semiconductor device which represent a process for fabricating a local interconnect structure in accordance with the present invention. In FIG. 2A, relevent portions of a semiconductor device 50 are illustrated. Semiconductor device 50 is formed in part from a substrate 52. Substrate 52 is typically a single crystal silicon wafer. Doped regions 54 are formed in substrate 52 by using conventional doping techniques, for instance ion implantation. Doping refers to introducing impurity atoms into the substrate material. Doped regions 54 of the device illustrated in FIG. 2A may function as source and drain elements, for example in an MOS (metal oxide semiconductor) transistor. A gate 56 is also formed as part of device 50. Gate 56 is made of polysilicon and is formed conventionally. The gate is isolated from substrate 52 by a gate oxide layer 58 and may also be isolated from doped regions 54 by, for example, sidewall spacers 59. Formation of doped regions, gates, gate oxide, and sidewall spacers is well known in the art. Any of the methods known for forming these elements may also be used in conjunction with the present invention.

Also included in device 50 of FIG. 2A are metal silicide regions 61. Silicide regions are formed by a known process called silicidation. Silicidation involves depositing a metal layer on the semiconductor device. Portions of the metal layer which are in contact with silicon, for example in contact with gate 56 and doped regions 54, react under certain thermal conditions to form metal silicide regions. Portions of the metal layer which are not in contact with silicon do not react and remain as metal. Unreacted portions of the metal layer can be removed from the device without affecting the silicide regions by using a selective etch chemistry. As illustrated in FIG. 2A unreacted portions of a metal layer have been removed while metal silicide regions 61 remain as part of the device. Various metals are capable of undergoing silicidation, including titanium and cobalt. For reasons to be described later, silicide regions 61 are preferably formed by reacting a cobalt layer with silicon.

Upon forming silicide regions 61 and removing any unreacted metal, a titanium layer 62 is deposited over the device, as illustrated in FIG. 2A. The titanium layer is patterned using known techniques, for instance lithography and etching, to form a titanium strap 64, as illustrated in FIG. 2B. In patterning the titanium layer it is important not to adversely affect other portions of semiconductor device 50. Etching a titanium layer selective to other portions of the semiconductor can be achieved using various etch chemistries. For example, a dry etch chemistry having a 1:1 volume ratio between $Cl_2$ gas and $HBr_2$ gas can be used in a plasma etch system operated at a pressure of 100 mTorr and using 350 watts of power. The $Cl_2/HBr$ etch chemistry selectively etches titanium without adversely affecting underlying cobalt silicide ($CoSi_2$) regions. If, on the other hand, silicide regions 61 are formed of titanium silicide ($TiSi_2$), more complex, but known, etching techniques may need to be employed. These etching techniques include wet chemical etching which often results in undercutting of the titanium strap 64. Because undercutting is harmful to the functionality of the strap, $CoSi_2$ is preferred for use with the present invention.

After patterning the titanium layer to form titanium strap 64, semiconductor device 50 undergoes a thermal nitridation in which titanium strap 64 is converted to titanium nitride. As FIG. 2B illustrates, the nitridation process involves exposing semiconductor device 50 to either an ammonia ($NH_3$) or a nitrogen ($N_2$) ambient. Nitrogen is incorporated into titanium strap 64, thereby forming a titanium nitride strap 66 as illustrated in FIG. 2C. Titanium nitride strap 66 is conductive and is able to electrically connect gate 56 to one of the doped regions 54 through conductive silicide regions 61. A preferred thermal process suitable for nitriding titanium to form the strap is a 500° C. anneal for thirty minutes in an NH₃ ambient. Rapid thermal processes such as 15 seconds at 545° C. in an ammonia ambient or 20 seconds at 700° C. in a nitrogen ambient have been used for nitriding titanium and are also suitable for use in the present invention. Temperatures and times are vary from those suggested and still be in accordance with the present invention. Times may range from, for example, 10 seconds to 60 minutes while temperatures may range from approximately 450° C. to 700° C. It is important to note that the higher the anneal temperature, the greater the extent of reaction between titanium strap 64 and silicide regions 61. While it is desirable for some reaction between the titanium and the silicide to occur in order for the two to make good electrical contact, the extent of reaction should be kept small enough to prevent excess consumption of silicon from doped regions 54 and from gate 56.

The process illustrated in FIGS. 2-2C has advantages over existing fabrication processes for forming local interconnect structures. Patterning a local interconnect in accordance with the present invention is not only a readily manufacturable process, but one which results in satisfactory electrical performance. Patterning the local interconnect does not cause harm to other portions of the semiconductor device because a metal used to form the interconnect can be etched selectively. Since nitridation occurs after the interconnect has been patterned, unwanted metal oxides, metal oxy-nitrides, and metal silicides do not have an opportunity to form on dielectric regions of the device. For instance in FIG. 2A, titanium layer 62 can be removed from sidewall spacers 59 and from a field oxide region 67 without leaving a conductive reaction product on these dielectric materials. As described earlier, existing processes which nitride the titanium layer prior to patterning the interconnect can result in an unwanted reaction between the titanium and dielectric regions, creating conductive areas which may cause short circuiting. The present invention does not have this disadvantage. Furthermore, contact resistance of local interconnects formed in accordance with the present invention is satisfactorily low because the local interconnect forms a good contact to silicide regions during the thermal nitridation process.

Figure 3:
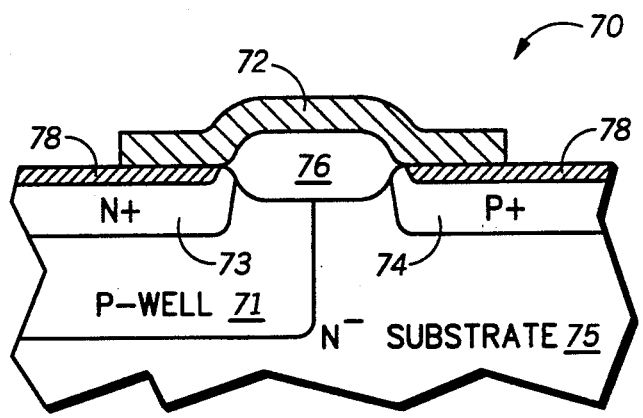
FIGS. 3 and 4 are each a cross-sectional view of a portion of a semiconductor device illustrating embodiments of the present invention in which a local interconnect is used to electrically connect two regions having opposite conductivity type.

Additional embodiments of the present invention are illustrated in the remaining figures. These figures illustrate various uses for local interconnect structures formed in semiconductor devices in accordance with the present invention. Suitable materials for each of these additional embodiments include those mentioned previously. FIG. 3 is a cross-sectional illustration of a semiconductor device 70 in which a local interconnect 72 is used to electrically connect two regions having opposite conductivity, namely an N-type doped region 73 and a P-type doped region 74. N-type doped region 73 and P-type doped region 74 are portions of a substrate 75 to which impurities have been added. The doped regions are separated by an oxide region 76. Further electrical isolation is accomplished by placing N-type doped region 73 in a p-well 71 formed within the substrate. If desired, silicide regions 78 may be formed in N-type doped region 73 and P-type doped region 74 in order to improve interconnect resistance. Structures similar to that illustrated in FIG. 3 can be used to connect source and drain regions of n-channel and p-channel transistors in CMOS (complimentary metal oxide semiconductor) devices and may be formed using a process in accordance with the present invention.

Figure 4:
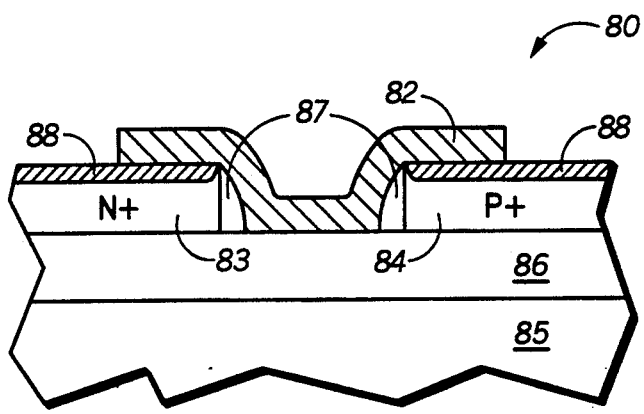

Instead of using a local interconnect to electrically connect two doped regions of a substrate, an interconnect 82 may be used to connect two polysilicon or other semiconductor features which have opposite conductivity, as illustrated in FIG. 4. A semiconductor device 80 has a substrate 85 over which two features, an N-type feature 83 and a P-type feature 84, have been formed. These features are isolated from the substrate by a dielectric layer 86 which is formed in or on substrate 85. N-type feature 83 and a P-type feature 84 may be polysilicon lines formed over a field oxide dielectric. Silicide regions 88 may also be formed within features 83 and 84 and sidewall spacers 87 may be formed along sides of features 83 and 84, as illustrated. One application of the local interconnect structure illustrated in FIG. 4 is for connection of silicided N+ and P+ regions of gate level polysilicon in a CMOS circuit to connect surface channel NMOS (n-channel MOS) and PMOS (p-channel MOS) transistors. The TiN local interconnect provides a good dopant diffusion barrier between the N+ and P+ while providing good electrical connection. If the N+ and P+ regions, are directly connected together without a silicide region, an undesired diode is formed. If only a silicide material is used to connect the N+ and P+ regions, the silicide can provide a path for dopant diffusion which leads to counter-doping. Counter-doping has significant undesirable effects on electrical properties of a device. The use of $CoSi_2$, and to a lesser extent $TiSi_2$, to electrically connect adjacent N+ and P+ polysilicon regions can result in significant counter-doping during typical thermal processes which occur during semiconductor device fabrication. The present invention avoids counter-doping effects.

Figure 5:
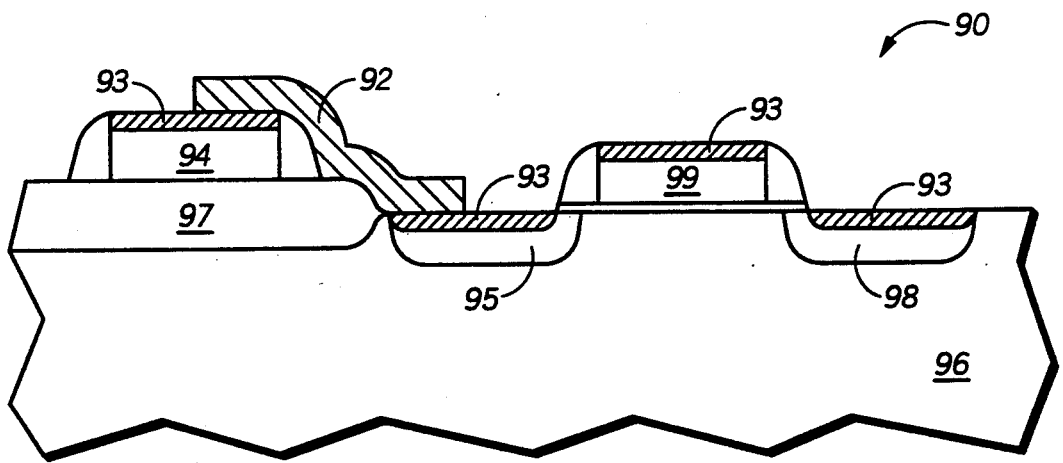
FIG. 5 is a cross-sectional view illustrating another embodiment of the present invention in which an interconnect structure is used to electrically connect an isolated gate to a doped substrate region.

Another embodiment of the present invention uses a local interconnect to electrically connect a doped region of a transistor to an isolated gate of a different transistor (not shown). As illustrated in FIG. 5, a local interconnect 92 electrically connects an isolated gate 94 to a doped region 95 of a substrate 96. Isolated gate 94 overlies and is separated from substrate 96 by a field oxide region 97. Doped region 95 may be a source or a drain of a transistor which is comprised of doped region 95, a doped region 98 and a gate 99. Local interconnects are often used to electrically connect source or drain regions to gates of different transistors in, for instance, cross-coupled CMOS devices, especially cross-coupled transistors in SRAM (static random access memory) cells. In such applications, the local interconnect replaces a buried contact structure. As in the previous embodiments, silicide regions 93 can be formed in silicon regions for improved performance characteristics.

Thus it is apparent that there has been provided, in accordance with the invention, a process for fabricating a local interconnect structure in a semiconductor device that fully meets the advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, a local interconnect formed in accordance with the present invention can be used to electrically connect any two conductive elements in a semiconductor device. The present invention is not limited by those local interconnect applications illustrated or described.

In addition, the invention is not limited to using the substrate or conductive element materials described, but may be used in conjunction with any materials and any process in which titanium or other metal nitride is to be employed as local interconnects. It should be understood that other metals may be used to form a local interconnect structure in accordance with the present invention. For example, zirconium, hafnium, vanadium, niobium, and tantalum nitride interconnects may be formed in accordance with the present invention. Furthermore, the process for forming local interconnects as taught herein need not employ silicidation. Also, the dimensions of the semiconductor devices illustrated, and elements thereof, may not be to scale and in no way limit the present invention. Therefore, it is intended that this invention encompass all such variations and modifications as fall within the scope of the appended claims.

We claim:

1. A process for fabricating a local interconnect structure in a semiconductor device, comprising the steps of:
   providing two silicon elements in the semiconductor device which are to be electrically connected;
   forming cobalt silicide regions over each of the two silicon elements;
   depositing a layer of metal onto the device;
   patterning the layer of metal to form a strap to connect the two cobalt silicide regions; and
   after patterning the layer of metal to form a strap, thermally nitriding the strap to form a conductive nitride interconnect.

2. The process of claim 1 wherein the step of depositing a layer of metal comprises depositing a layer of metal selected from the group consisting of titanium, hafnium, zirconium, vanadium, niobium, and tantalum.

3. The process of claim 1 wherein the step of providing two silicon elements comprises providing a polysilicon element and a single crystal silicon element.

4. The process of claim 3 wherein the step of providing a polysilicon element and a single crystal silicon element comprises providing a polysilicon element and a single crystal silicon element which has been doped.

5. The process of claim 1 wherein the step of providing two silicon elements comprises providing two polysilicon elements.

6. A process for fabricating a local interconnect structure in a semiconductor device, comprising the sequential steps of:
   providing two silicon elements in the semiconductor device;
   depositing a cobalt layer on the device so that the cobalt layer is in contact with the two silicon elements;
   reacting portions of the cobalt layer with each of the two silicon elements to form two cobalt silicide regions;
   removing unreacted portions of the cobalt layer from the device;
   depositing a titanium layer on the device so that the titanium layer is in contact with the two cobalt silicide regions;
   patterning the titanium layer to form a titanium strap which connects the two cobalt silicide regions; and
   converting the titanium strap to a titanium nitride strap by a thermal reaction, the titanium nitride strap electrically interconnecting the two silicon elements.

7. The process of claim 6 wherein the step of converting the titanium strap to a titanium nitride strap comprises thermally reacting the titanium strap in a nitrogen ambient.

8. The process of claim 6 wherein the step of converting the titanium strap to a titanium nitride strap comprises thermally reacting the titanium strap in an ammonia ambient.

9. The process of claim 6 wherein the step of providing two silicon elements comprises providing two doped silicon elements.

10. The process of claim 6 wherein the step of providing two silicon elements comprises providing at least one polysilicon element.

11. A process for fabricating a local interconnect structure in a semiconductor device, comprising the sequential steps of:
   providing two conductive features in the semiconductor device which are to be electrically connected;
   depositing a layer of conductive material on the semiconductor device;
   patterning the layer of conductive material to form a strap which electrically connects the two conductive features; and
   thermally nitriding the strap to form a conductive nitride interconnect.

12. The process of claim 11 wherein the step of thermally nitriding the strap comprises thermally nitriding the strap for a period of time substantially within the range of 10 seconds to 60 minutes at a temperature substantially within the range of 450°–700° C.

13. The process of claim 11 wherein the step of patterning the layer of conductive material comprises etching selected portions of the layer of conductive material with a mixture of $Cl_2$ and HBr gases.

14. The process of claim 11 wherein the step of depositing a layer of conductive material comprises depositing a layer of titanium.

* * * * *